(12) United States Patent
Morita et al.

(10) Patent No.: US 7,867,877 B2
(45) Date of Patent: Jan. 11, 2011

(54) METHOD FOR MANUFACTURING SOI WAFER

(75) Inventors: Etsuro Morita, Tokyo (JP); Akihiko Endo, Tokyo (JP)

(73) Assignee: Sumco Corporation, Tokyo (JP)

( * ) Notice: Subject to any disclaimer, the term of this patent is extended or adjusted under 35 U.S.C. 154(b) by 417 days.

(21) Appl. No.: 10/587,725

(22) PCT Filed: Jan. 28, 2005

(86) PCT No.: PCT/JP2005/001226

§ 371 (c)(1),
(2), (4) Date: Jul. 26, 2006

(87) PCT Pub. No.: WO2005/074033

PCT Pub. Date: Aug. 11, 2005

(65) Prior Publication Data

US 2007/0161199 A1 Jul. 12, 2007

(30) Foreign Application Priority Data

Jan. 30, 2004 (JP) .............................. 2004-024851

(51) Int. Cl.
*H01L 21/30* (2006.01)

(52) U.S. Cl. ........................ 438/459; 438/528; 438/706; 438/795; 438/974

(58) Field of Classification Search ............ 257/E21.32; 438/528, 458, 459, 706, 795–799, 974
See application file for complete search history.

(56) References Cited

U.S. PATENT DOCUMENTS

| 6,312,797 B1 * | 11/2001 | Yokokawa et al. ......... 428/336 |
| 2003/0087503 A1 * | 5/2003 | Sakaguchi et al. ......... 438/406 |

(Continued)

FOREIGN PATENT DOCUMENTS

JP 64-072533 3/1989

(Continued)

OTHER PUBLICATIONS

Translation of Imai et al. (JP 02228061).*

(Continued)

*Primary Examiner*—Matthew C Landau
*Assistant Examiner*—Candice Y Chan
(74) *Attorney, Agent, or Firm*—Kolisch Hartwell, PC

(57) ABSTRACT

A method for manufacturing SOI wafers is provided which allows the obtaining of a thin SOI layer having uniform in-plane thickness. In this manufacturing method, an oxygen ion implanted layer is first formed on an active layer wafer. This is then laminated to a base wafer with a embedded oxide film interposed therebetween. The active layer wafer side of the laminated wafer is then ground to remove a portion thereof. The remaining surface side of the active layer wafer is removed by polishing or KOH etching to expose the oxygen ion implanted layer. Oxygen ions are implanted to a uniform depth within the plane of the oxygen ion implanted layer in this oxygen ion implanted layer. Subsequently, oxidizing treatment is carried out to form an oxide film on the exposed surface of the oxygen ion implanted layer. Moreover, this oxide film is removed together with the oxygen ion implanted layer by an HF solution. The remaining portion of the active layer wafer serves as a thin SOI layer.

13 Claims, 2 Drawing Sheets

U.S. PATENT DOCUMENTS

2005/0014346 A1  1/2005  Mitani et al.

FOREIGN PATENT DOCUMENTS

| JP | 02-058873 | 2/1990 |
| JP | 02-228061 | 9/1990 |
| JP | 04115511 | 4/1992 |
| JP | 04206766 | 7/1992 |
| JP | 05-129258 | 5/1993 |
| JP | 07226433 | 8/1995 |
| JP | 09-116125 | 5/1997 |
| JP | 11-040512 | 2/1999 |
| JP | 11-067896 | 3/1999 |
| JP | 11-145074 | 5/1999 |
| JP | 2000-124092 | 4/2000 |
| JP | 2003-257900 | 9/2003 |
| WO | 9320584 A1 | 10/1993 |
| WO | 03/046993 | 6/2003 |
| WO | WO 2004/010505 A1 | 1/2004 |

OTHER PUBLICATIONS

International Search Report dated Apr. 14, 2005 for International Application No. PCT/JP2005/001226.

Japanese Patent Office, "Notice of Reasons for Rejection" for JP 2005-517519, mailing date Mar. 3, 2009, including English-language translation. JP 2005-517519 is a counterpart of this U.S. application.

Gassel et al., "SIMOX and Wafer Bonding: Combination of Competitors Complements One Another." Abstract No. 847, 1046b Extended Abstracts, Spring Meeting (1993), pp. 1246-1247.

Tong et al., "VLSI SOI Fabrication by Simox Wafer Bonding (SWB)." Institute of Electrical and Electronics Engineers (1992), pp. 72-73.

Yang et al., "Silicon-on-Insulator-with-Active-Substrate (SOIAS) Technology." Proceedings 1996 IEEE International SOI Conference (1996), pp. 106-107.

Patent Office of Japan; "Decision of Rejection" for Japanese Patent Application 2005-517519; mailing date Oct. 20, 2009; seven pages including English-language translation. The JP2005-517519 application is a foreign counterpart of U.S. Appl. No. 10/587,725.

* cited by examiner

METHOD FOR MANUFACTURING SOI WAFER

TECHNICAL FIELD

The present invention relates to a method for manufacturing silicon-on-insulator (SOI) wafers, and more particularly, to a method for manufacturing SOI wafers by a lamination method.

Priority is claimed on Japanese Patent Application No. 2004-24851, filed Jan. 30, 2004, the content of which is incorporated herein by reference.

BACKGROUND ART

SOI wafers are superior to conventional silicon wafers in terms of inter-element separation, reduction of parasitic capacitance between elements and substrate, and three-dimensional structure, and are used in high-speed, low-power-consumption LSI. Lamination methods are used to produce SOI wafers. These methods consist of forming an oxide film and bonding two silicon wafers followed by grinding and polishing to form an SOI layer. In addition, the Smart Cut method (registered trademark) is included in these lamination methods.

In addition, SOI layers have recently come to be required to be thinner and have a more uniform thickness in the aforementioned SOI manufacturing methods. Although chemical mechanical polishing (CMP) is currently used to reduce thickness in the Smart Cut method, this requirement is unable to be met due to the difficulty of uniformly polishing the entire wafer surface with high precision. Technologies like that described in the following Patent Document 1, for example, have been proposed to reduce thickness and achieve uniform thickness of SOI layers. Namely, while an oxide film is formed on a base wafer, a highly concentrated impurity layer of boron and so forth is formed on an active layer wafer surface by thermal diffusion or ion implantation followed by lamination thereof. Next, the active layer wafer side is ground and the silicon portion remaining after grinding is etched to expose the highly concentrated impurity layer. Moreover, the highly concentrated impurity layer is oxidized and this oxide film is removed with HF solution to prepare an SOI wafer.

In addition, the following technology is proposed in the following Patent Document 2. Namely, in the preparation of SOI wafers by the Smart Cut method, the wafer surface is first subjected to oxidation treatment following separation to form an oxide film. The oxide film is then removed using an aqueous HF solution. Subsequently, the wafer is heat treated in a reducing atmosphere containing hydrogen to smooth the surface.

Normally, when reducing SOI thickness, the uniformity of the in-plane film thickness is required to be 5 to 10% or less. If this is not satisfied, there is a considerable effect on the electrical characteristics (for example, variations in switching time) of the transistor formed on the SOI layer.

However, according to the technology described in the aforementioned Patent Document 1, in the case of etching silicon remaining on the ground surface, there are no large differences between the etching rate for the Si of the etching liquid and that for the highly concentrated impurity layer. Thus, when the Si surface is etched after grinding, the highly concentrated impurity layer is also etched, and uniform in-plane thickness of the highly concentrated impurity layer is not obtained. Accordingly, in-plane uniformity cannot be retained for the film thickness of the SOI layer.

In addition, according to the technology described in the Patent Document 2, smoothing treatment is carried out by utilizing the etching effects of hydrogen gas. However, since a vertical oven is used during this hydrogen annealing or argon gas annealing, it is difficult to control the etching rates according to the gas between the center and outer edge of the SOI wafer due to the non-uniformity of gas flow. Consequently, etching unevenness occurs easily and the film thickness of the SOI layer becomes non-uniform due to this etching unevenness.

| [Patent Document 1] | Japanese Unexamined Patent Application, First Publication, (JP-A) No. H09-116125 |
| [Patent Document 2] | Japanese Unexamined Patent Application, First Publication, (JP-A) No. 2000-124092 |

DISCLOSURE OF THE INVENTION

Therefore, an object of the present invention is to provide a method for manufacturing SOI wafers capable of achieving in-plane uniformity of thickness in a thin-film SOI layer of SOI wafers.

In order to achieve this object, the present invention is a method for manufacturing SOI wafers in which a laminated wafer is formed by laminating an active layer wafer to a base wafer with an insulating film interposed therebetween, followed by reducing the thickness of the active layer wafer side to produce an SOI wafer, comprising the steps of: implanting oxygen ions into the active layer wafer to form an oxygen ion implanted layer on the active layer wafer; reducing the oxygen in the vicinity of the surface layer of the oxygen implanted wafer by out diffusion by heat treating in a reducing atmosphere; forming a laminated wafer by laminating the active layer wafer onto a base wafer with an insulating film interposed therebetween; allowing a portion of the active layer wafer to remain on the surface side of the oxygen ion implanted layer by grinding the active layer wafer portion of the laminated wafer; exposing the oxygen ion implanted layer by polishing or etching a portion of the remaining active layer wafer; forming an oxide film of a predetermined thickness on the exposed surface of the oxygen ion implanted layer by oxidation treatment of the laminated wafer; and, removing the oxide film.

There are no limitations on the insulating film (for example, oxide film) formed between the active layer wafer and the base wafer.

In addition, there are no limitations on the implantation acceleration voltage and dose of oxygen ions implanted in the active layer wafer. These conditions are suitably selected according to the target film thickness of the SOI layer. Grinding of the active layer wafer of the laminated wafer is carried out by mechanical processing. As a result of this grinding, a portion of the active layer wafer remains on the surface side of the oxygen ion implanted layer. There are no limitations on the film thickness of the remaining active layer wafer.

An alkaline etching solution is used for etching.

Oxidation treatment is carried out, for example, in an oxidizing atmosphere, and there are no limitations on the treatment temperature. Oxidation treatment is carried out, for example, in an oxidizing atmosphere at a temperature of 600 to 1000° C. There are also no limitations on the thickness of the oxide film subjected to oxidation treatment.

Subsequent removal of the oxide film may be carried out by cleaning with an HF solution, or etching may be used by annealing using hydrogen gas, Ar gas or a gas containing HF.

Following removal of the oxide film, the SOI wafer is immersed in, for example, a mixture of organic acid and hydrofluoric acid to remove particles and metal impurities adhered to the surface of the SOI wafer.

In this method for manufacturing SOI wafers, an oxygen ion implanted layer is formed at a predetermined depth of an active layer wafer. Next, a laminated wafer is formed by laminating the active layer wafer to a base wafer with an insulating film interposed therebetween. Subsequently, the active layer wafer portion of the laminated wafer is ground to leave a portion of the active layer wafer (film thickness: approx. 5 μm) on the surface side of the oxygen ion implanted layer. Next, only a portion of the remaining active layer wafer is polished. Alternatively, a portion of the remaining active layer wafer is etched with an alkaline etching solution. As a result, the oxygen ion implanted layer is exposed.

Oxygen ions are (can be) uniformly implanted within the plane of the oxygen ion implanted layer of the laminated wafer. Accordingly, the exposed oxygen ion implanted layer is formed uniformly within the plane thereof and to a roughly uniform thickness. Thus, an oxide film of a predetermined thickness is formed on the exposed surface of the oxygen ion implanted layer by oxidation treatment. As a result, the thickness of the SOI layer can be reduced and the film thickness thereof can be made to be uniform.

In addition, the present invention is a method for manufacturing SOI wafers in which ions of hydrogen or a noble gas element are implanted in an active layer wafer through an insulating film to form an ion implanted layer on the active layer wafer, this active layer wafer is laminated to a base wafer with an insulating film interposed therebetween to form a laminated wafer, this laminated wafer is subjected to heat treatment, and a portion of the laminated wafer is separated at the boundary with the ion implanted layer to produce an SOI wafer, comprising the steps of: injecting oxygen ions from the separated surface of the SOI wafer following separation to form an oxygen ion implanted layer between the separated surface and the insulating film; exposing the oxygen ion implanted layer by polishing or etching a portion of the active layer wafer from the separated surface to the oxygen ion implanted layer; forming an oxide film of a predetermined thickness on the exposed surface of the oxygen ion implanted layer by subjecting the SOI wafer to oxidation treatment; and, removing this oxide film.

In this case, the wafer surface portion which is shallower than the oxygen ion implanted layer becomes the SOI layer. Consequently, it is necessary to heat the substrate to a temperature of 400 to 600° C. during implantation to inhibit implantation damage during implantation. In the present invention, however, since the surface layer portion is polished or etched, it is not necessary to control the substrate temperature since implantation damage is not required to be taken into consideration.

In this method for manufacturing SOI wafers, an ion implanted layer is first formed on an active layer wafer (such as a wafer in which an oxide film has been formed on a silicon wafer). Next, this active layer wafer is laminated onto a base wafer (such as a silicon wafer) with an insulating film interposed therebetween. As a result of laminating the active layer wafer and the base wafer, a laminated wafer is formed in which an insulating film is interposed at the lamination interface. Subsequently, this laminated wafer is heat treated at a set temperature (for example, approximately 500° C.). As a result, the entire surface of the laminated wafer is completely eliminated to the boundary of the ion implanted layer. Subsequently, oxygen ions are implanted into the exposed surface of the SOI wafer under predetermined conditions. As a result, an oxygen ion implanted layer is formed to a predetermined depth.

Next, heat treatment is carried out at a high temperature of 1100° C. or higher to strengthen bonding of the laminated surfaces. The atmosphere at this time is not limited to a reducing atmosphere or oxidizing atmosphere. As a result of this heat treatment, the implanted oxygen layer becomes an $SiO_2$ layer, which is better suited for stopping polishing.

Subsequently, the $SiO_2$ layer is polished to the oxygen ion implanted layer to expose the ion implanted layer. As a result, in addition to reducing the thickness of the SOI layer, the thickness thereof can be made to be uniform.

In the method for manufacturing SOI wafers of the present invention, a portion of the aforementioned active layer wafer is preferably polished while supplying an abrasive having an abrasive particle concentration of 1% by weight or less.

An alkaline solution containing abrasive particles (such as silicon) at a concentration of 1% by weight or less can be used for the abrasive. Examples of alkaline solutions include inorganic alkaline solutions (such as KOH or NaOH), organic alkaline solutions and mixed solutions thereof.

In this method for manufacturing SOI wafers, a portion of the aforementioned active layer wafer is polished while supplying an abrasive in which the abrasive particle (silica) concentration is 1% by weight or less.

The abrasive has an abrasive particle concentration of 1% by weight or less. Accordingly, it has chemical polishing action without hardly any mechanical polishing action attributable to the abrasive particles.

A portion of the active layer wafer on the surface side of the SOI wafer (Si layer) is polished by the chemical polishing action of the alkaline solution. The alkaline solution has a high $Si/SiO_2$ etching rate. Consequently, the Si layer in the form of a portion of the active layer wafer can be polished efficiently.

Subsequently, the Si layer is polished to expose the oxygen ion implanted layer. Chemical polishing by the alkaline solution does not act on the oxygen ion implanted layer. Consequently, the oxygen ion implanted layer is hardly polished at all. As a result, the oxygen ion implanted layer can be uniformly exposed.

Moreover, in the method for manufacturing SOI wafers of the present invention, a portion of the aforementioned active layer wafer is preferably etched using an alkaline etching solution.

KOH, for example, is used for the alkaline etching solution.

In this method for manufacturing SOI wafers, a portion of the active layer wafer is etched using an alkaline etching solution. Although the etching speed of the alkaline etching solution is slower than that of an acidic etching solution, the selectivity of the etching rate between silicon and silicon oxide is large. As a result, the oxygen ion implanted layer can be exposed by only etching a portion of the active layer wafer.

As has been explained above, according to the present invention, in a method for manufacturing SOI wafers using a lamination method, an oxygen ion implanted layer is formed on an active layer wafer. Next, a laminated wafer is produced and then polished while leaving a portion of the active layer wafer. Subsequently, a portion of the active layer wafer is polished while supplying an abrasive having an abrasive particle concentration of 1% by weight or less to expose the oxygen ion implanted layer. At this time, oxygen ions are uniformly implanted within the plane of the ion implanted layer. Subsequently, oxidation treatment is carried out to form an oxide film after which it is removed together with the oxygen ion implanted layer. As a result, the thickness of the SOI layer is reduced and the film thickness thereof is made to be uniform.

In addition, the thickness of the SOI layer can be reduced and the thickness thereof made to be uniform by implanting oxygen ions in an SOI wafer produced according to the Smart Cut method as well.

BEST MEANS FOR CARRYING OUT THE INVENTION

The following provides an explanation of embodiments of the present invention with reference to the drawings.

First Embodiment

Figure 1:
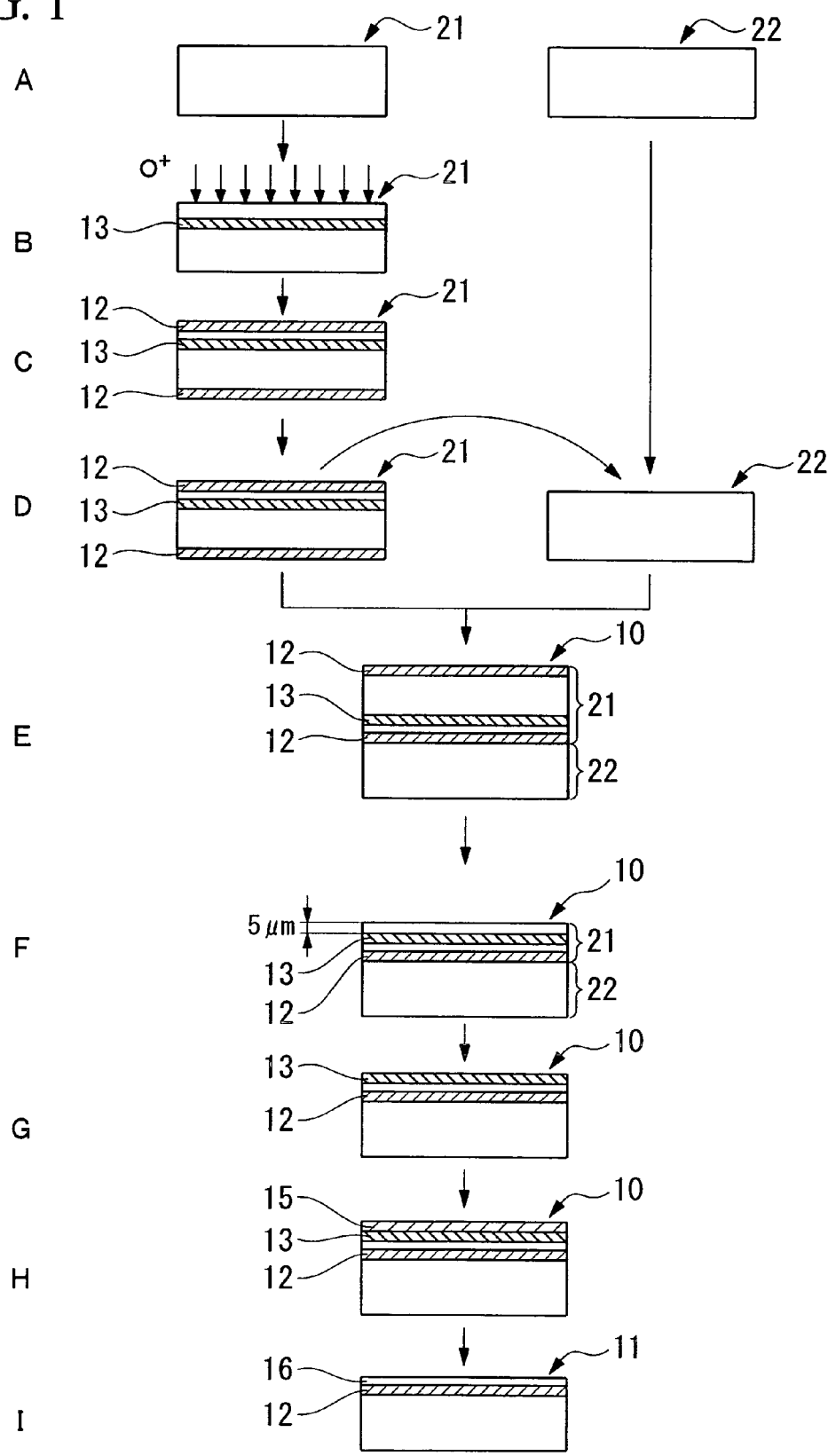
FIG. 1 is a flow chart showing a method for manufacturing SOI wafers by a lamination method as claimed in a first embodiment of the present invention.

An explanation is first provided of a method for manufacturing an SOI wafer 11 according to a lamination method with reference to FIG. 1. First, as shown in A of FIG. 1, two silicon wafers having a diameter of 200 mm are prepared by slicing from a silicon ingot grown by the CZ method and doped with boron. One of the silicon wafers is used as an active layer wafer 21 (specific resistance: 1 to 10 Ω·cm), while the other silicon wafer is used as a base wafer 22 (specific resistance: 10 to 20 Ω·cm).

Next, as shown in B of FIG. 1, the active layer wafer 21 is placed in a vacuum chamber of an ion implantation device. Oxygen ions are then implanted from the surface of the active layer wafer 21 under conditions of an acceleration voltage of 170 keV and dose within the range of 5.0E16 to 5.0E17 atoms/cm$^2$, and preferably a dose within the range of 1.0E17 to 3.0E17 atoms/cm$^2$. Oxygen ions are implanted to a predetermined depth from the surface of the active layer wafer 21. As a result, an oxygen ion implanted layer 13 is formed to a depth of about 3000 Å from the surface of the active layer wafer 21.

Next, oxygen in the vicinity of the surface layer of the oxygen implanted wafer is reduced by diffusing to the outside by carrying out heat treatment in a reducing atmosphere. Argon is used for the atmosphere, and heat treatment is carried out for about 2 hours at a temperature of 1100° C. or higher. As a result of this heat treatment, the formation of oxygen precipitates in the SOI layer of the final SOI wafer caused by implantation of oxygen ions is inhibited, thereby allowing the production of an SOI wafer having few crystal defects.

Subsequently, as shown in C of FIG. 1, an oxide film (BOX layer) 12 is formed on the surface of the silicon wafer serving as the active layer wafer 21. Formation of the oxide film 12 is carried out by inserting the silicon wafer into an oxidizing oven and heating for 4 hours at a temperature of 1000° C. At this time, the thickness of the formed oxide film 12 is 1500 Å. Furthermore, this step may be carried out prior to the aforementioned oxygen ion implantation step.

Next, as shown in D of FIG. 1, the active layer wafer 21 is laminated to the base wafer 22 with the oxygen ion implanted surface (the oxide film 12 surface) as the laminated surface. As a result, as shown in E of FIG. 1, a laminated wafer 10 is formed in which an insulating film (the oxide film 12) is interposed at the lamination interface.

Subsequently, lamination heat treatment is carried out on the laminated wafer 10 to strengthen the bonding between the active layer wafer 21 and the base layer 22. The conditions of this heat treatment consist of a duration of about 2 hours and a temperature of 1100° C. or higher in an oxidizing gas atmosphere. As a result of carrying out the aforementioned heat treatment, a portion of the implanted oxygen ions change to an oxygen precipitate ($SiO_2$), thereby enhancing the selectivity of subsequent polishing or etching.

Next, as shown in F of FIG. 1, the surface of the active layer wafer 21 of laminated wafer 10 (side on the opposite side of the laminated surface) is ground to a predetermined thickness using a grinding device. A portion of the active layer wafer 21 (film thickness: approx. 5 μm) is thus allowed to remain on the surface side of the oxygen ion implanted layer 13.

As shown in G of FIG. 1, the surface of the ground laminated wafer 10 is then polished using an ordinary polishing device (not shown) while supplying an abrasive containing abrasive particles having an abrasive particle (silica) concentration of 1% by weight or less. An alkaline solution having an abrasive particle concentration of 1% by weight or less, for example, is used for the abrasive. An organic alkaline solution having an amine as its primary component (for example, piperazine or ethylene diamine) is used for the alkaline solution.

A portion of the active layer wafer 21 (Si layer) is polished as a result of the chemical polishing action of the alkaline solution. The alkaline solution has a high $Si/SiO_2$ etching rate. Consequently, the alkaline solution is able to efficiently polish a portion of the active layer wafer 21 in the form of an Si layer.

Subsequently, the Si is polished to expose the oxygen ion implanted layer 13. The oxygen ion implanted layer 13 is hardly polished at all since it is not acted on by the chemical polishing action of the alkaline solution. Furthermore, the oxygen ion implanted layer 13 is formed uniformly within the plane of the SOI wafer 11. As a result, the oxygen ion implanted layer 13, which is uniformly formed within the plane of the SOI wafer 11, is exposed.

Alternatively, a portion of the active layer wafer 21 can also be etched using an alkaline etching solution. More specifically, the laminated wafer 10 on which grinding has been completed is immersed in an alkaline etching solution (liquid temperature: 85° C.) in which KOH has been dissolved in pure water (DIW). Furthermore, this alkaline etching solution contains KOH at 10% by weight. In addition, hydrogen peroxide ($H_2O_2$) is added to this etching solution at 0.1% by weight. As a result, the $Si/SiO_2$ etching rate becomes 300 or more, making it difficult for the etching solution to dissolve the oxide film ($SiO_2$). Thus, when etching is carried out using this alkaline etching solution, the portion of the active layer wafer 21 remaining after the aforementioned grinding is removed, and the oxygen ion implanted layer 13 is exposed.

Subsequently, as shown in H of FIG. 1, wet heat treatment is carried out on the laminated wafer 10 for 0.5 hours at a temperature of 950° C. and in an oxidizing atmosphere. As a result, an oxide film 15 of a predetermined thickness is formed on the exposed surface of the oxygen ion implanted layer 13.

Next, as shown in I of FIG. 1, this oxide film 15 is removed by, for example, HF etching (HF solution composition: 10%, temperature: 20° C.). As a result, the thickness of an SOI layer 16 exposed following removal of the oxide film is decreased and uniform within the plane.

The above-mentioned series of steps (oxidation treatment and HF etching) may be repeated several times. As a result, the thickness of the SOI layer 16 can be reduced while maintaining smoothed roughness. Namely, in the case of removing a large amount of the SOI layer 16, the thickness of the SOI layer 16 is reduced by repeating the steps of forming the oxide film 15 by oxidation treatment followed by removing the oxide film 15 by, for example, HF etching.

Next, the laminated wafer 10 is cleaned using the treatment described below. First, the laminated wafer 10 is respectively immersed in an aqueous solution containing an organic acid in the form of citric acid in pure water at 0.06% by weight, an aqueous solution in which hydrofluoric acid has been added at 0.05% by weight, an aqueous solution in which an organic acid in the form of citric acid has been added to pure water at 0.6% by weight, and finally a room temperature, dissolved ozone aqueous solution having an ozone concentration of 5 ppm. The laminated wafer 10 is immersed for 5 minutes in each solution at room temperature. After cleaning, the laminated wafer 10 is heat treated by holding at a temperature of 1200° C. for 1 hour in an argon gas atmosphere. The SOI wafer 11 is completed by carrying out the aforementioned steps.

As a result of carrying out the aforementioned steps, the oxygen ion implanted layer 13 is formed as a result of ions being uniformly implanted and at a uniform depth within the plane of the active layer wafer 21. The active layer wafer 21 is polished until the oxygen ion implanted layer 13 is exposed. Subsequently, the oxide film 15 is formed by oxidation treatment, and if this is removed together with the oxygen ion implanted layer 13, the SOI layer 16 can be made to be reduced in thickness and have a uniform thickness. The film thickness of the SOI layer 16 formed in this manner can be controlled at 200 to 700 Å. Variation in the distribution of the in-plane film thickness of each film is within 5%.

Second Embodiment

Figure 2:
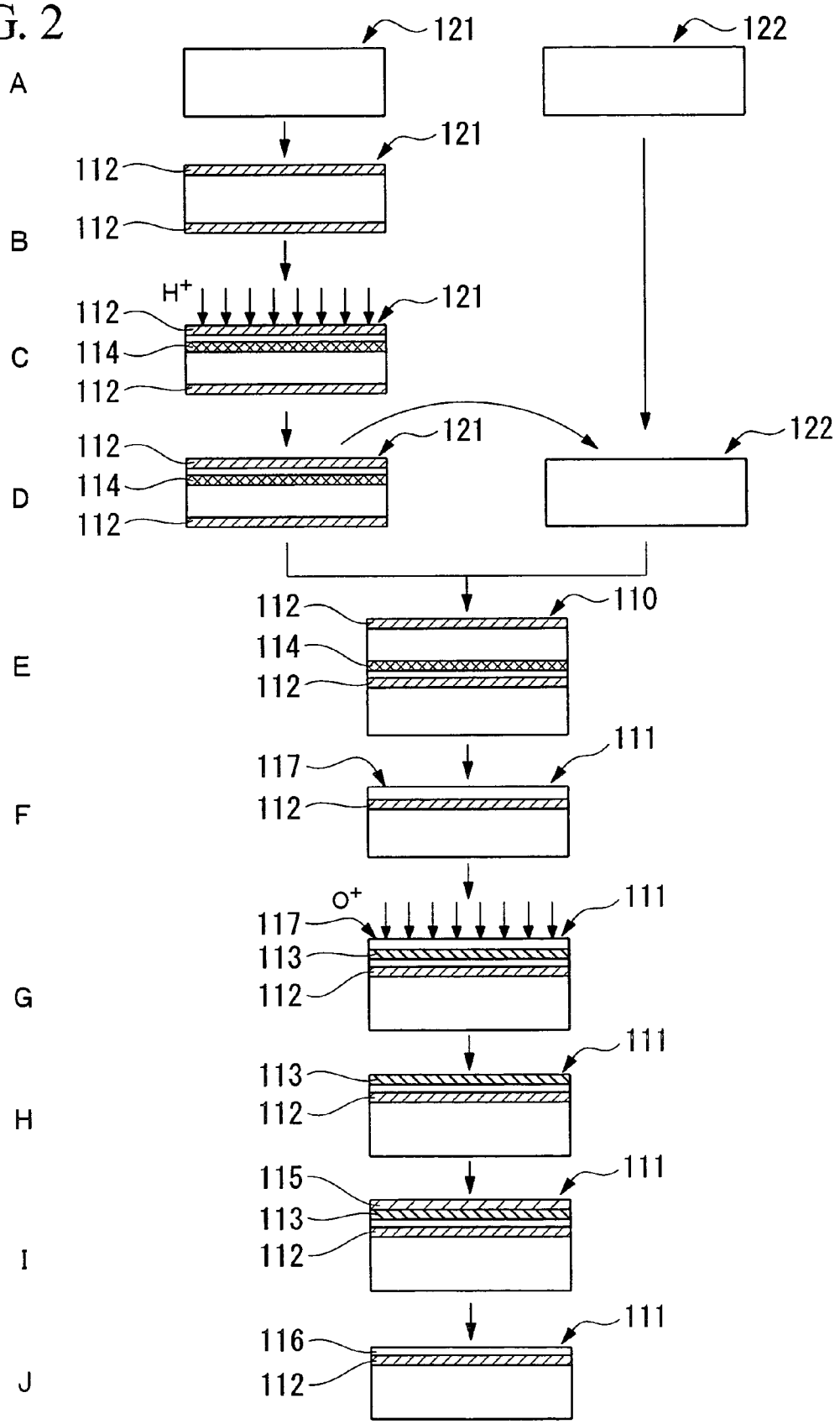
FIG. 2 is a flow chart showing a method for manufacturing SOI wafers by a lamination method as claimed in a second embodiment of the present invention.

Next, an explanation of a second embodiment of the present invention is provided with reference to FIG. 2 regarding a method for manufacturing SOI wafers according to the Smart Cut method.

First, as shown in A of FIG. 2, two silicon wafers having a diameter of 200 mm are prepared by slicing from a silicon ingot grown by the CZ method and doped with boron. One of the silicon wafers is used as an active layer wafer 121, while the other silicon wafer is used as a base wafer 122.

Next, as shown in B of FIG. 2, an oxide film 112 is formed on the surface of the silicon wafer to serve as the active layer wafer 121. The formation of the oxide film 112 is carried out by placing the silicon wafer in an oxidizing oven and heating for 4 hours at a temperature of 1000° C. At this time, the thickness of the oxide film 112 is 1500 Å.

Next, the active layer wafer 121 on which the oxide film 112 has been formed is placed in a vacuum chamber of an ion implantation device. As shown in C of FIG. 2, hydrogen ions are then implanted from the surface of the active layer wafer 121 through the oxide film 112 at an acceleration voltage of 50 keV and dose of $5.0E17$ atoms/cm². The hydrogen ions are implanted to a predetermined depth from the surface of the active layer wafer 121. As a result, a hydrogen ion implanted layer 114 is formed to a predetermined depth (about 4500 Å) of the active layer wafer 121.

Next, as shown in D of FIG. 2, the active layer wafer 121 into which hydrogen ions have been implanted is laminated to the base wafer 122 with the hydrogen ion implanted surface (the oxide film 112 surface) as the laminated surface. As a result, a laminated wafer 110 is formed in which the oxide film 112 is interposed at the lamination interface.

As shown in E of FIG. 2, separation treatment is carried out on the laminated wafer 110 in a heat treatment chamber. At this time, the inside of the heat treatment chamber is maintained at a nitrogen gas atmosphere at a temperature of about 500° C. for 30 minutes.

Whereupon, bubbles of noble gas (hydrogen gas) form in the hydrogen ion implanted layer 114 of the laminated wafer 110, and a portion of the laminated wafer 110 (portion of the active layer wafer 121) separates at the boundary with the hydrogen ion implanted layer 114 in which said bubbles have formed. As a result, an SOI wafer 111 is formed as shown in F of FIG. 2.

Next, as shown in G of FIG. 2, oxygen ions are implanted in a separation surface 117 of the SOI wafer 111 after separation. The implantation conditions at this time consist of an acceleration voltage of 40 keV, dose within the range of $5.0E16$ to $5.0E17$ atoms/cm², and preferably $1.0E17$ to $3.0E17$ atoms/cm². As a result, the oxygen ion implanted layer 113 is formed at a depth of about 500 Å from the separation surface 117 of the SOI wafer 111 (between the separation surface 117 and the oxide film 112).

Subsequently, lamination strengthening heat treatment is carried out on the SOI wafer 111 to strengthening the bonding between the active layer wafer 121 and the base wafer 122. The conditions of this heat treatment consist of a duration of about 2 hours and a temperature of 1100° C. or higher in an Ar gas atmosphere.

Next, as shown in H of FIG. 2, the surface of the SOI wafer 111 is polished while supplying an abrasive having an abrasive particle concentration of 1% by weight or less to expose the surface of the oxygen ion implanted layer 113. Alternatively, a portion of the active layer wafer is etched using an alkaline etching solution. The methods used to polish and etch the active layer wafer are the same as those described in the aforementioned first embodiment.

Subsequently, as shown in I of FIG. 2, wet heat treatment is carried out on the SOI wafer 11 for 1 hour at a temperature of 650° C. and in an oxidizing atmosphere. As a result, an oxide film 115 of a predetermined thickness is formed on the exposed surface of the oxygen ion implanted layer 113.

As shown in J of FIG. 2, this oxide film 115 is removed by, for example, HF etching. As a result, the thickness of an SOI layer 116 is decreased and made to be uniform.

Finally, particles were removed from the surface of the SOI layer 16 followed by carrying out heat treatment in an argon gas atmosphere to complete the SOI wafer 111.

An experiment was carried out to confirm the uniformity of the SOI layer 116 (film thickness: 500 Å) produced according to the SOI wafer manufacturing method of the present invention in a method for manufacturing SOI wafers according to the Smart Cut method. In addition, an experiment was carried out to compare the presence and absence of an oxygen ion implanted layer and CMP polishing and an abrasive cloth by changing the polishing conditions (no abrasive particles). Those results are shown in Table 1.

TABLE 1

| | Oxygen ion implanted layer | Thickness reduction method | Variation of SOI layer (maximum–minimum) |
|---|---|---|---|
| Comparative Example 1 | Absent | CMP | >100 Å |
| Comparative Example 2 | Present | CMP | >100 Å |
| Comparative Example 3 | Absent | Abrasive cloth (no abrasive particles) | >100 Å |
| Present Invention | Present | Abrasive cloth (no abrasive particles) | 20 Å |

According to the results of Table 1, the method for manufacturing SOI wafers of the present invention was confirmed to improve the uniformity of the SOI layer 116 as compared with ordinary methods for manufacturing SOI wafers by CMP polishing.

While preferred embodiments of the invention have been described and illustrated above, it should be understood that these are exemplary of the invention and are not to be considered as limiting. Additions, omissions, substitutions and other modifications can be made without departing from the spirit or scope of the present invention. Accordingly, the invention is not to be considered as being limited by the aforementioned description, and is only limited by the scope of the appended claims.

INDUSTRIAL APPLICABILITY

According to the method for manufacturing SOI wafers of the present invention, the thickness of an SOI layer can be reduced and the thickness thereof can be made to be uniform in SOI wafers produced according to a lamination method or Smart Cut method.

The invention claimed is:

1. A method for manufacturing SOI wafers in which a laminated wafer is formed by laminating an active layer wafer to a base wafer with an insulating film interposed therebetween, followed by reducing the thickness of the active layer wafer side to produce an SOI wafer, comprising the steps of:
implanting oxygen ions into the active layer wafer to form an oxygen ion implanted layer on the active layer wafer;
reducing the oxygen in the vicinity of the surface layer of the active layer wafer by out diffusion by heat treating the active layer wafer on which the oxygen ion implanted layer has been formed in a reducing atmosphere;
forming a laminated wafer by laminating the active layer wafer onto a base wafer with an insulating film interposed therebetween;
allowing a portion of the active layer wafer to remain on the surface side of the oxygen ion implanted layer by grinding the active layer wafer portion of the laminated wafer;
exposing the oxygen ion implanted layer by polishing or etching a portion of the remaining active layer wafer;
forming an oxide film of a predetermined thickness on the exposed surface of the oxygen ion implanted layer by oxidation treatment of the laminated wafer;
removing the oxide film, and
removing the oxygen ion implanted layer by etching.

2. The method for manufacturing SOI wafers according to claim 1 wherein, the oxygen dose in the step for forming the oxygen ion implanted layer is 5.0E16 to 5.0E17 atoms/cm$^2$.

3. The method for manufacturing SOI wafers according to claim 1 or claim 2 wherein, the step for exposing the oxygen ion implanted layer is carried out by polishing a portion of the active layer wafer while supplying an abrasive having an abrasive particle concentration of 1% by weight or less.

4. The method for manufacturing SOI wafers according to claim 1 or claim 2 wherein, the step for exposing an oxygen ion implanted layer is carried out by etching a portion of the active layer wafer using an alkaline etching solution.

5. The method for manufacturing SOI wafers according to claim 1 wherein, a lamination heat treatment is carried out on the laminated wafer under a temperature of 1100° C. in an oxidizing gas atmosphere for changing a portion of the implanted oxygen ions to an oxygen precipitate.

6. The method for manufacturing SOI wafers according to claim 1 wherein, the oxygen dose in the step for forming the oxygen ion implanted layer is 1.0E17 to 3.0E17 atoms/cm$^2$.

7. The method for manufacturing SOI wafers according to claim 1 wherein, the step for exposing an oxygen ion implanted layer is carried out by etching a portion of the active layer wafer using an alkaline etching solution that includes a pure water, KOH, and a hydrogen peroxide.

8. A method for manufacturing SOI wafers in which ions of hydrogen or a noble gas element are implanted in an active layer wafer through an insulating film to form an ion implanted layer on the active layer wafer, the active layer wafer is laminated to a base wafer with an insulating film interposed therebetween to form a laminated wafer, the laminated wafer is subjected to heat treatment, and a portion of the laminated wafer is separated at the boundary with the ion implanted layer to produce an SOI wafer, comprising the steps of:
injecting oxygen ions from the separated surface of the SOI wafer following separation to form an oxygen ion implanted layer between the separated surface and the insulating film;
exposing the oxygen ion implanted layer by polishing or etching a portion of the active layer wafer from the separated surface to the oxygen ion implanted layer;
forming an oxide film of a predetermined thickness on the exposed surface of the oxygen ion implanted layer by subjecting the SOI wafer to oxidation treatment;
removing this oxide film, and
removing the oxygen ion implanted layer by etching.

9. The method for manufacturing SOI wafers according to claim 8 wherein, the oxygen dose in the step for forming the oxygen ion implanted layer is 5.0E16 to 5.0E17 atoms/cm$^2$.

10. The method for manufacturing SOI wafers according to claim 8 or claim 9 wherein, the step for exposing the oxygen ion implanted layer is carried out by polishing a portion of the active layer wafer while supplying an abrasive having an abrasive particle concentration of 1% by weight or less.

11. The method for manufacturing SOI wafers according to claim 8 or claim 9 wherein, the step for exposing an oxygen ion implanted layer is carried out by etching a portion of the active layer wafer using an alkaline etching solution.

12. The method for manufacturing SOI wafers according to claim 8 wherein, the oxygen dose in the step for forming the oxygen ion implanted layer is 1.0E17 to 3.0E17 atoms/cm$^2$.

13. The method for manufacturing SOI wafers according to claim 8 wherein, the step for exposing an oxygen ion implanted layer is carried out by etching a portion of the active layer wafer using an alkaline etching solution that includes a pure water, KOH, and a hydrogen peroxide.

* * * * *